(12) United States Patent
Inoue

(10) Patent No.: US 6,185,510 B1
(45) Date of Patent: Feb. 6, 2001

(54) PLL JITTER MEASURING METHOD AND INTEGRATED CIRCUIT THEREWITH

(75) Inventor: Tomoo Inoue, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/047,444

(22) Filed: Mar. 25, 1998

(30) Foreign Application Priority Data

Mar. 27, 1997 (JP) .................................................. 9-075383

(51) Int. Cl.[7] .......................... G01R 13/00; G01R 23/20
(52) U.S. Cl. ............................................. 702/69; 324/622
(58) Field of Search ................................. 702/57, 66, 69,
702/70, 71, 72, 83, 84, 89, 116, 117, 182,
183, 190, FOR 104, 109, 110, 170, 64,
75, 79, 106, 107, 118, 120, 121, 124–126,
189; 324/620, 622, 623, 625; 714/30

(56) References Cited

U.S. PATENT DOCUMENTS 5,295,079 * 3/1994 Wong et al. ........................ 714/715
5,381,085 * 1/1995 Fischer ............................... 324/76.48
5,485,490 * 1/1996 Leung et al. .......................... 375/371
5,889,435 * 3/1999 Smith et al. ........................... 331/1 A

FOREIGN PATENT DOCUMENTS

| 61-151483 | 7/1986 | (JP) . |
| 62-11181 | 1/1987 | (JP) . |
| 8-62298 | 3/1996 | (JP) . |

* cited by examiner

Primary Examiner—Marc S. Hoff
Assistant Examiner—Manuel L. Barbee
(74) Attorney, Agent, or Firm—Foley & Lardner

(57) ABSTRACT

A PLL jitter measuring method used for an integrated circuit with a PLL that generates an internal clock signal is disclosed, that comprises the steps of extracting jitter information of the internal clock signal of the PLL as an output signal to the outside of the integrated circuit without removing a package of the integrated circuit, and measuring the jitter of the internal clock signal with the extracted output signal.

6 Claims, 4 Drawing Sheets

PLL JITTER MEASURING METHOD AND INTEGRATED CIRCUIT THEREWITH

BACKGROUND OF THE INVENTION

1. Field of the Invention

The present invention relates to an integrated circuit having a PLL that generates an internal clock signal and to a PLL jitter measuring method thereof.

2. Description of the Related Art

In recent years, integrated circuits have been increasingly used for data transmission systems. As an example of data transmission systems, a so-called Rambus system that bidirectionally transmits data between a master device and a slave device is known.

In the Rambus system, data is transmitted from a master device to a slave device in synchronization with a transmission clock signal (that is referred to as cfm (clock from master) signal). The slave device receives the transmission data from the master device in synchronization with the transmission clock cfm signal. On the other hand, data is transmitted from the slave device to the master device in synchronization with a transmission clock signal (that is referred to as ctm (clock to master) signal). The master device receives the transmission signal from the slave device in synchronization with the transmission clock ctm signal.

Each of the master device and the slave device used in the Rambus system should internally generate the transmission clock signal and the reception clock signal that synchronizes with the transmission clock signal. Thus, each of the master device and the slave device has a PLL that generates the transmission clock signal and another PLL that generates the reception clock signal and that is a phase locked loop which is asynchronized with the transmission clock signal of the master device or the slave device.

On the other hand, in the data transmission systems such as the Rambus system, the transmission clock signal and the reception clock signal should be prevented from being affected by clock skews due to jitters. In particular, when the frequencies of the transmission clock signal and the reception clock signals are high, the influences of the jitters to these clock signals should be monitored and prevented so that the relevant integrated circuit can be normally operated.

In the master device and the slave device used in the Rambus system, the jitter of the transmission clock signal generated by the PLL is indirectly measured by monitoring and testing the transmission data that is output from each device to the outside.

However, the jitter of the reception clock signal generated in each device is not output to the outside thereof. Thus, this jitter cannot be measured from the outside of the device.

Consequently, as a conventional jitter measuring method, the package of the integrated circuit of each device is removed. A measurement probe is directly contacted to the PLL that generates the reception clock signal. The output signal of the PLL is observed with an oscilloscope so as to measure the jitter of the reception clock signal.

However, in the conventional method, to measure the jitter of the PLL that generates the reception clock signal, the package of the integrated circuit should be removed. Thus, it is impossible to measure jitters of all integrated circuits to be tested.

On the other hand, in Japanese Patent Laid-Open Publication No. 8-62298, a semiconductor integrated circuit testing method is disclosed. In this method, data that is input to a high speed interface portion is looped as output data back to the high speed interface portion. The output data is tested by an LSI tester.

However, this related art reference teaches only the loopback of input data to the outside. However, it teaches neither a reception clock signal generated in an integrated circuit, nor the measurement of a jitter of a reception clock signal.

SUMMARY OF THE INVENTION

An object of the present invention is to provide a PLL jitter measuring method that allows a jitter of an internal clock signal generated by a PLL and that is not output to the outside of an integrated circuit to be measured without need to remove the package of the integrated circuit.

Another object of the present invention is to provide a PLL jitter measuring method suitable for an integrated circuit that structures a master device or a slave device of the Rambus system.

A further object of the present invention is to provide an integrated circuit that outputs a signal containing a jitter component of an internal clock signal generated therein and that allows a jitter of the internal clock signal to be measured from the outside of the integrated circuit.

A more further object of the present invention is to provide an integrated circuit that allows a jitter of an external clock signal or a transmission clock signal that is output to the outside to be measured.

A first aspect of the present invention is a PLL jitter measuring method used for an integrated circuit with a PLL that generates an internal clock signal, comprising the steps of extracting jitter information of the internal clock signal of the PLL as an output signal to the outside of the integrated circuit without removing a package of the integrated circuit, and measuring the jitter of the internal clock signal with the extracted output signal. The integrated circuit has a PLL measurement functional circuit for outputting the jitter fs information to the outside along with the PLL that generates the internal clock signal. The output signal is sent to an IC tester or the like through the PLL measurement function circuit.

A second aspect of the present invention is an integrated circuit, comprising a PLL for generating an internal clock signal, and a PLL measurement functional circuit having a function for measuring a jitter of the internal clock signal of the PLL, wherein the PLL measurement functional circuit has a sending means for receiving an input signal for measuring the jitter of the internal clock frequency of the PLL, sampling the input signal with the internal clock signal, and sending the sampled signal as an output signal to the outside of the integrated circuit. Thus, an integrated circuit that allows a jitter of an internal clock signal to be measured without need to remove the package thereof can be obtained. These and other objects, features and advantages of the present invention will become more apparent in light of the following detailed description of a best mode embodiment thereof, as illustrated in the accompanying drawings.

DESCRIPTION OF PREFERRED EMBODIMENT

Next, with reference to the accompanying drawings, an integrated circuit according to an embodiment of the present invention and a jitter measuring method thereof will be described.

Figure 1:
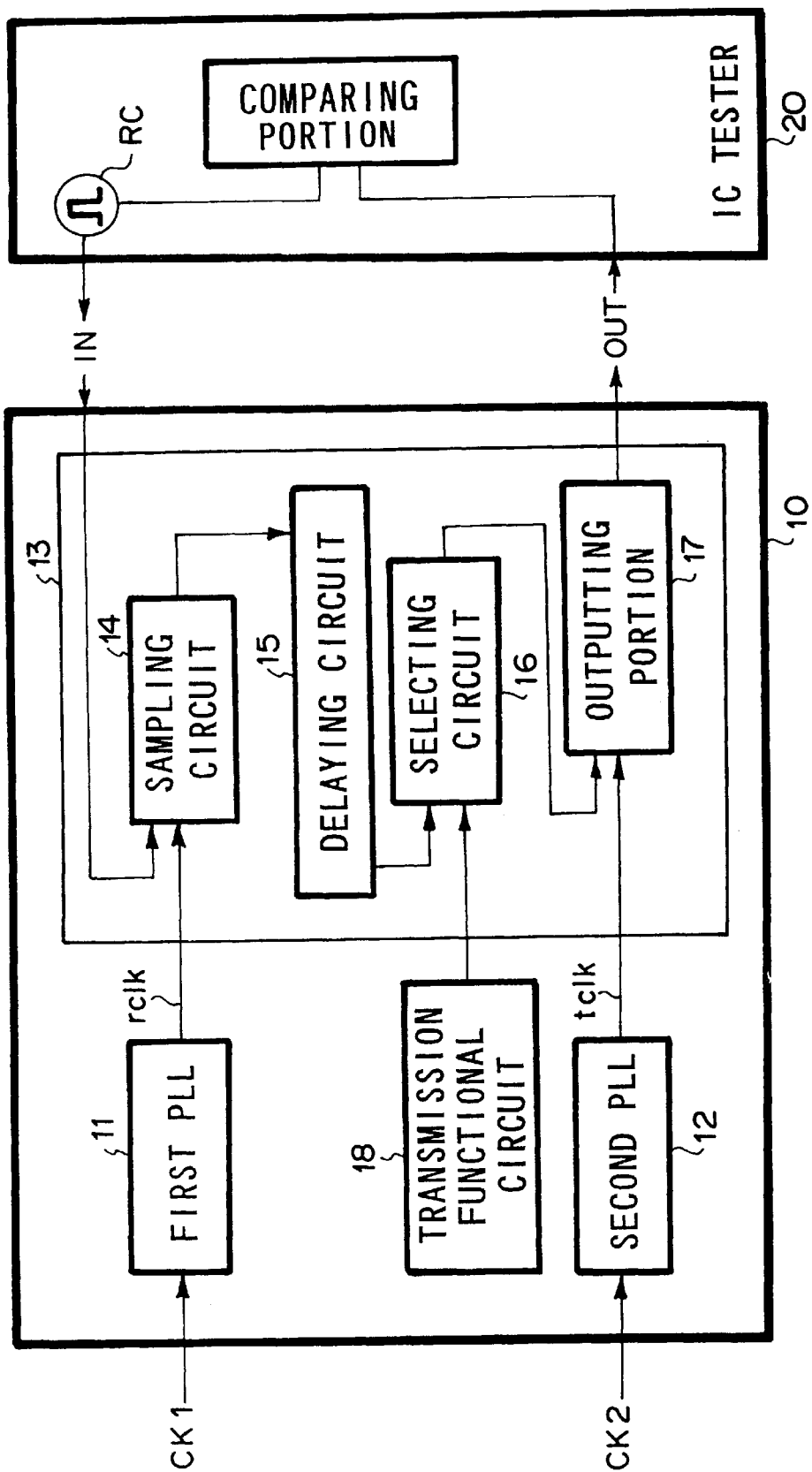
FIG. 1 is block diagram showing an outlined structure of an integrated circuit used for a PLL jitter measuring method according to the present invention.

With reference to FIG. 1, an integrated circuit 10 according to the present invention has a first PLL 11 and a second PLL 12. The first PLL 11 generates a reception clock signal rclk for sampling an input signal. The second PLL 12 generates a transmission clock signal tclk for synchronizing with an output signal. A first clock pulse CK1 and a second clock pulse CK2 are sent from the outside of the integrated circuit 10 to the first PLL 11 and the second PLL 12, respectively. The reception clock signal rclk is distributed to a functional circuit such as a logic circuit (not shown) of the integrated circuit 10. The transmission clock signal tclk is used to send transmission data of a transmission functional circuit 18 that has a transmission function to the outside of the integrated circuit 10.

The integrated circuit 10 has a PLL jitter measurement functional circuit 13 that measures a jitter of the reception clock signal rclk generated by the first PLL 11. The PLL jitter measurement functional circuit 13 receives transmission data from the transmission functional circuit 18. The PLL jitter measurement functional circuit 13 selectively transmits reception data in synchronization with the reception clock signal rclk or transmission data received from the transmission functional circuit 18 in synchronization with the transmission clock signal tclk.

In reality, the PLL jitter measurement functional circuit 13 has a sampling portion 14, a delaying circuit 15, a selecting circuit 16, and an outputting portion 17. The sampling portion 14 receives reception data (as an input signal IN) and the reception clock signal rclk, samples the reception data with the reception clock signal rclk, and obtains a sampled signal. The delaying circuit 15 successively stores the sampled signal, delays it for a predetermined time period, and sends the delayed sampled signal to the selecting circuit 16. The selecting circuit 16 selectively outputs the delayed sampled signal or the transmission data received from the transmission functional circuit 18 to the outputting portion 17. In the jitter measuring mode, the selecting circuit 16 outputs the delayed sampled signal to the outputting portion 17. In the normal mode, the selecting circuit 16 outputs the transmission data received from the transmission functional circuit 18 to the outputting portion 17. The outputting portion 17 outputs the transmission data as an output signal OUT in synchronization with the transmission clock signal tclk.

The integrated circuit shown in FIG. 1 has a test input terminal and a test output terminal for inputting and outputting the input signal IN and the output signal OUT, respectively. When a conventional IC tester is connected to the test input terminal and the test output terminal, the PLL jitter measurement functional circuit 13 is enabled.

In this example, it is assumed that the test input terminal and the test output terminal are disposed independent from the conventional reception data input terminal and transmission data output terminal. Alternatively, the test input terminal and the test output terminal may be structured in common with the conventional reception data input terminal and transmission data output terminal, respectively. However, as in the latter case, when the terminals are used in common, a switch for switching between the jitter measuring mode and the normal transmission/reception mode is required.

In the example shown in FIG. 1, when the jitter of the reception clock signal rclk generated by the first PLL 11 is measured, the IC tester 20 is connected to the integrated circuit 10. The IC tester 20 sends a test signal as the input signal IN to the integrated circuit 10. In this case, the selecting circuit 16 selects the delayed sampled signal received from the delaying circuit 15 as the transmission data and outputs the delayed sampled signal as the output signal OUT from the outputting portion 17.

The sampling portion 14 samples the test signal received as the input signal IN from the test input terminal with the reception clock signal rclk and successively sends the sampled signal to the delaying circuit 15. The delaying circuit 15 delays the sampled signal for a predetermined time period and sends the delayed signal as the output signal OUT to the IC tester 20 through the selecting circuit 16 and the outputting portion 17.

Figure 2:
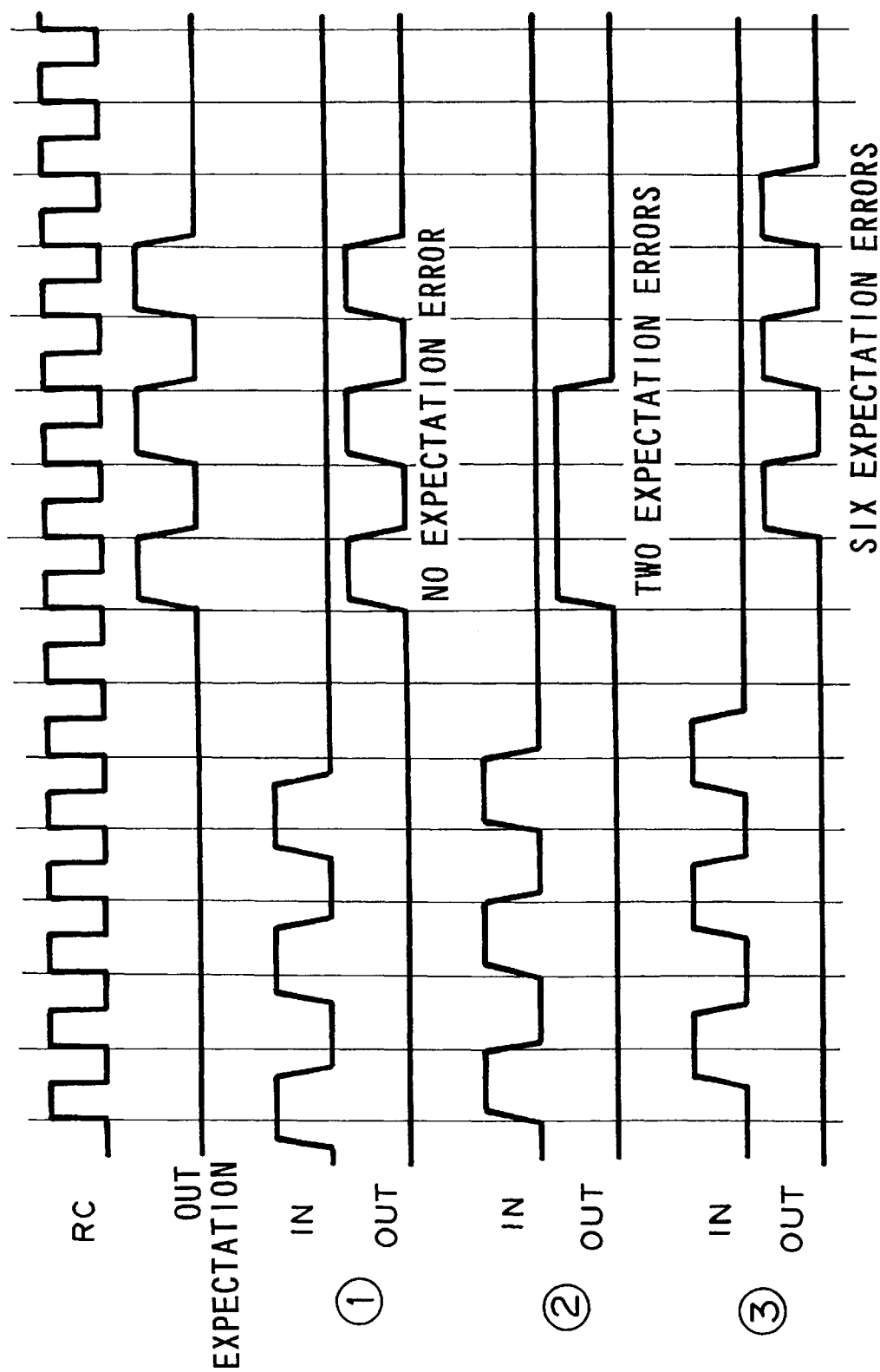
FIG. 2 is a time chart for explaining a PLL jitter measuring method using the integrated circuit shown in FIG. 1.

Next, with reference to FIG. 2, the jitter measuring operation of the IC tester 20 will be described. The IC tester 20 generates a reference clock signal RC with a predetermined clock frequency. In FIG. 2, the IC tester 20 sends a test data signal as the input signal IN to the PLL jitter measurement functional circuit 13 of the integrated circuit 10 in synchronization with the reference clock signal RC. The frequency of the test data signal shown in FIG. 2 is twice higher than the frequency of the reference clock signal RC. The test data signal is composed of first to third data pulses. The sampling portion 14 samples the test data signal with the reception clock signal rclk generated by the first PLL 11 and sends the sampled signal as the output signal OUT to the IC tester 20 through the delaying circuit 15, the selecting circuit 16, and the outputting portion 17. A comparing means 21 of the IC tester 20 compares the output signal OUT with the reference clock signal RC. It is assumed that the frequency of the reception clock signal rclk is the same as the frequency of the reference clock signal RC generated by the IC tester 20.

In this situation, it is assumed that the sample timing position of the input signal IN delicately varies due to a jitter of the reception clock signal rclk. In this case, the number of expectation errors of the output signal OUT varies corresponding to the edge position of the input timing of the input signal IN. The number of expectation errors can be calculated as a jitter of the reception clock signal rclk of the input signal IN. In this case, the number of expectation errors is treated as population and statistically processed.

In more reality, in FIG. 2, to measure the jitter of the reception clock signal rclk, by intentionally varying the phase of the input signal IN, the IC tester 20 measures the number of expectation errors. As shown in FIG. 2 (1), when the position of the timing edge of the input signal IN is slightly in advance of the position of the reference clock signal RC, no expectation error takes place in the output signal OUT. On the other hand, as shown in FIG. 2 (2), when the position of the timing edge of the input signal IN matches the position of the timing edge of the reference clock signal RC, two expectation errors take place in the output signal OUT. When the position of the timing edge of the input signal IN has a delay from the timing edge of the reference clock signal RC by a half period thereof, six expectation errors take place in the output signal OUT Thus, by successively shifting the phase of the input signal IN and measuring the relation between each phase and the number of expectation errors that take place in the output signal OUT, the jitter can be measured.

Figure 3:
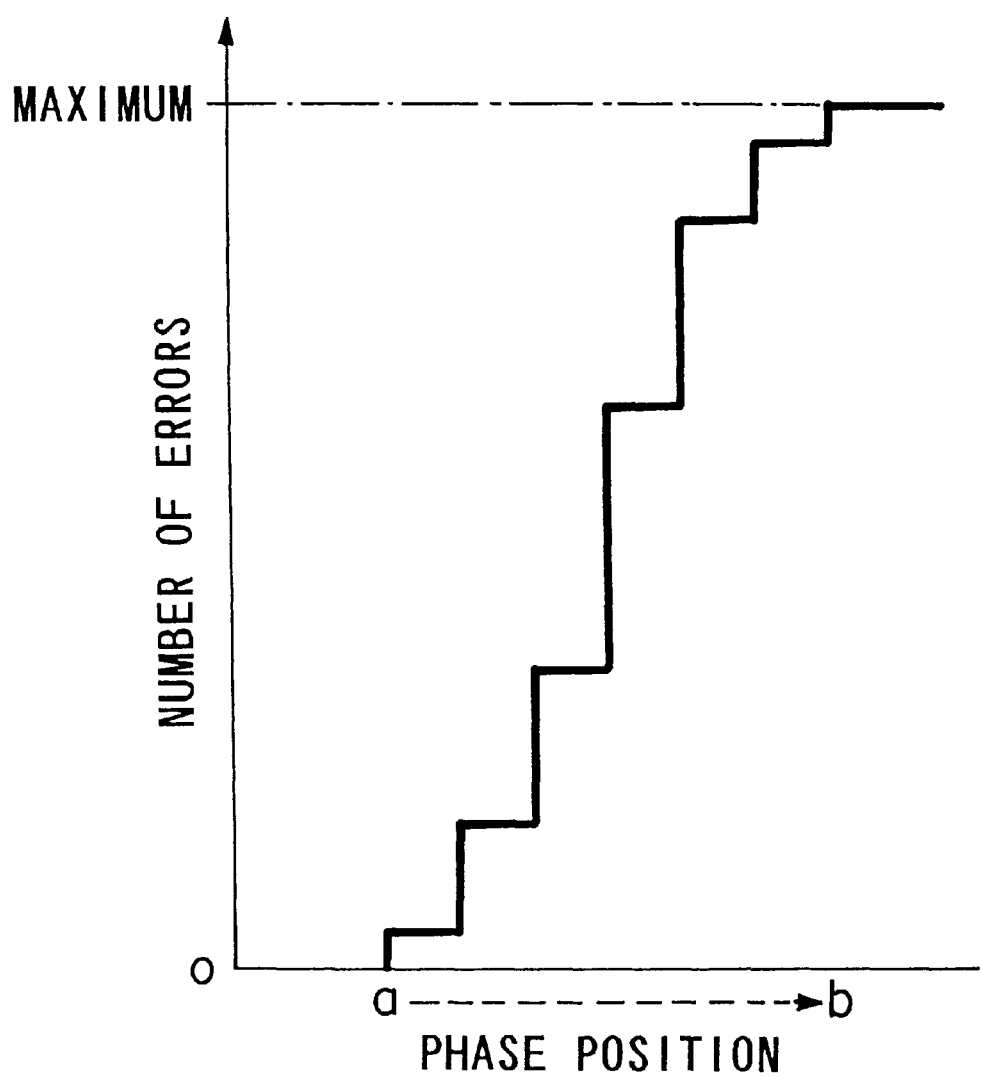
FIG. 3 is a graph showing the relation between the phase and the number of expectation errors.

FIG. 3 shows the relation between the phase position ranging from a to b of the input signal IN and the number of expectation errors that take place in the output signal OUT. In FIG. 3, at the phase a, the number of expectation errors is 0. At the phase b, the number of expectation errors is maximum.

Figure 4:
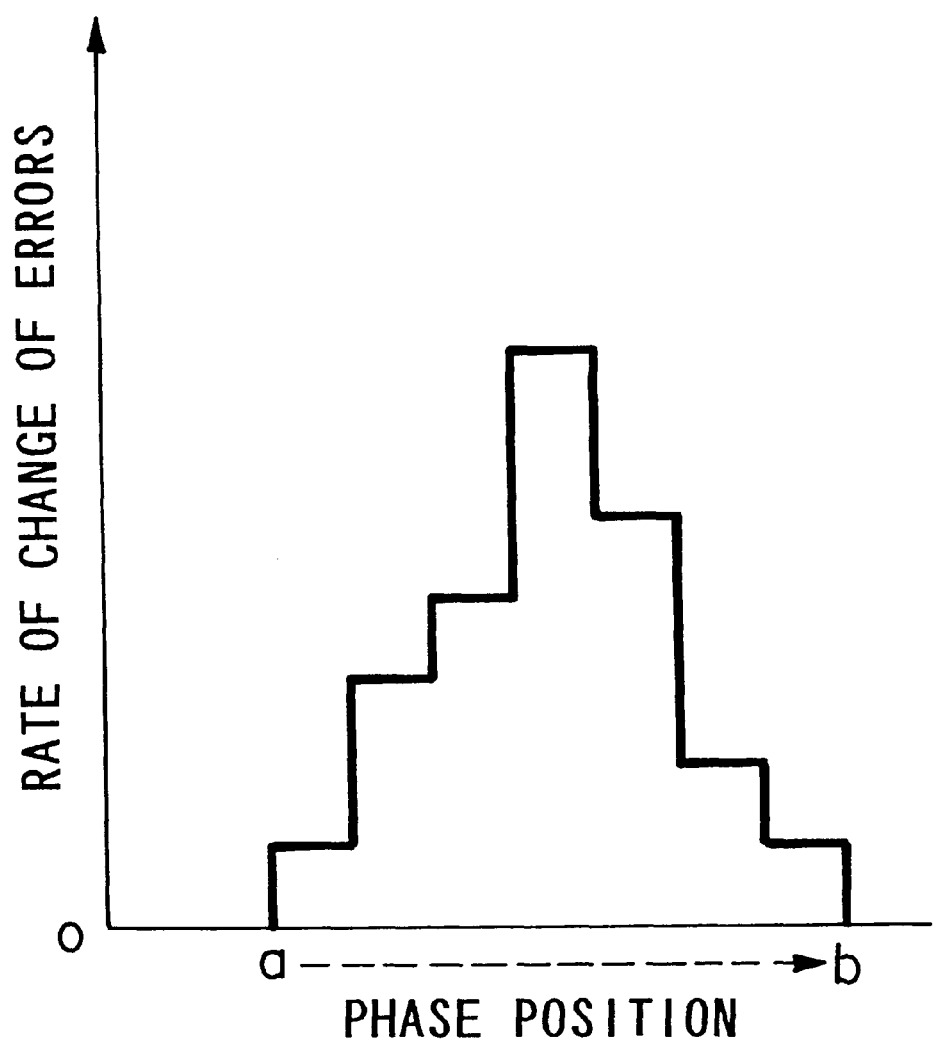
FIG. 4 is a histogram showing the relation between the phase and the rate of change of expectation errors for explaining an example of a jitter measuring operation.

FIG. 4 shows the relation between the phase position ranging from a to b of the input signal IN and the rate of change of the number of expectation errors. In FIG. 4, assuming that the rate of change of the expectation errors is normally distributed, a standard deviation is obtained as a jitter of the reception clock signal rclk. In any case, the expectation errors of the output signal OUT are counted. The rate of change of the number of expectation errors is obtained. The rate of change is statistically processed. Thus, the jitter of the reception clock signal rclk that samples the input signal IN can be measured.

The edge at which the phase of the reference signal RC and the phase of the input signal IN are compared for detecting the expectation errors should be selected so that the output signal OUT is not affected by the jitter of the transmission clock signal tclk.

EXAMPLE

In the PLL jitter measuring method according to the present invention, a jitter of a high speed clock signal with a frequency ranging from 250 to 300 MHz could be measured. In addition, according to the present invention, a jitter on the order of 4 nsec or less could be measured.

As described above, in an integrated circuit having a PLL that generates a clock signal that is not output to the outside thereof, a jitter of the clock signal of the PLL can be measured with an IC tester without need to remove the package of the integrated circuit. In addition, according to the present invention, an integrated circuit that allows a jitter of an internal clock signal generated by a PLL to be measured without need to remove the package of the integrated circuit can be obtained.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A PLL jitter measuring method used for an integrated circuit with a PLL that generates an internal reception clock signal, wherein the integrated circuit has a PLL measurement functional circuit for outputting the jitter information to the outside along with the PLL that generates the internal clock signal, comprising:
sending an input signal to the integrated circuit;
sampling the input signal with the internal clock signal;
sending the sampled signal to a delay circuit where the sampled signal is delayed for a predetermined time;
outputting the delayed sampled signal as the output signal;
extracting jitter information of the internal clock signal of the PLL as the output signal to the outside of the integrated circuit without removing a package of the integrated circuit; and
measuring the jitter of the internal clock signal with the extracted output signal.

2. The PLL jitter measuring method as set forth in claim 1,
wherein the integrated circuit has a PLL measurement functional circuit for outputting the jitter information to the outside along with the PLL that generates the internal clock signal, and
wherein the method further comprises:
outputting the output signal to the outside through the PLL measurement functional circuit.

3. The PLL jitter measuring method as set forth in claim 2,
wherein the jitter of the internal clock signal of the PLL is measured by an IC tester that operates with a reference clock signal.

4. An integrated circuit, comprising:
a PLL for generating an internal clock signal; and
a PLL measurement functional circuit having a function for measuring a jitter of the internal clock signal of the PLL,
wherein said PLL measurement functional circuit comprises:
receiving means for receiving an input signal from an IC tester for measuring the jitter of the internal clock of the PLL;
sampling means for sampling the input signal with the internal clock signal;
delaying means for delaying the sampled signal received from said sampling means for a predetermined time period; and
sending means for outputting the sampled signal as an output signal to the outside of the integrated circuit,
wherein after the output signal is compared by the IC tester with a reference signal delayed by the predetermined time period from the input signal, the IC tester outputs a number of expectation errors calculated as the jitter of the internal clock.

5. The integrated circuit as set forth in claim 4,
wherein said sending means receives a transmission signal and the sampled signal and selectively outputs the transmission signal or the sampled signal to the outside of the integrated circuit.

6. An integrated circuit having a semiconductor circuit based on Rambus standard, comprising:
a transmission PLL circuit for generating a clock signal for a transmission signal;
a reception PLL circuit for generating an internal clock signal for a reception signal;
an input terminal for receiving a test signal from the outside of the integrated circuit;
a sampling circuit for sampling the test signal received from said input terminal with the internal clock signal and outputting the resultant signal as a sampled signal;
an output terminal for selectively outputting the sampled signal received from said sampling circuit or an output signal of a transmission functional circuit of the semiconductor circuit;
a delaying circuit for delaying the sampled signal received from said sampling circuit for a predetermined time period; and
an outputting portion for combining an output signal of said transmission functional circuit of the semiconductor circuit and the clock signal generated by said transmission PLL circuit.

* * * * *